United States Patent [19]
Kuster

[11] Patent Number: 6,115,939
[45] Date of Patent: Sep. 12, 2000

[54] PROCESS AND APPARATUS FOR THE TREATMENT OF FLAT-FORM MATERIAL ESPECIALLY OF PRINTED CIRCUIT BOARDS

[75] Inventor: Kaspar Kuster, Therwil, Switzerland

[73] Assignee: Ciba Specialty Chemicals Corp., Tarrytown, N.Y.

[21] Appl. No.: 09/060,688

[22] Filed: Apr. 15, 1998

[30] Foreign Application Priority Data

Apr. 24, 1997 [EP] European Pat. Off. ............. 97106810

[51] Int. Cl.[7] .................................................. F26B 25/18
[52] U.S. Cl. ................... 34/194; 34/210; 34/216; 34/217
[58] Field of Search ............. 34/201, 194, 236, 34/210, 203, 216, 217, 218, 219, 209

[56] References Cited

U.S. PATENT DOCUMENTS

| | | | |
|---|---|---|---|
| 68,294 | 8/1867 | Erkenbrecher | 34/209 |
| 1,689,099 | 10/1928 | Applegate | 34/194 |
| 3,638,605 | 2/1972 | Grandgirard | 118/50.1 |
| 4,663,860 | 5/1987 | Beall | 34/13.4 |
| 4,711,038 | 12/1987 | Uimonen | 34/25 |
| 4,926,789 | 5/1990 | Wenger et al. | 118/668 |
| 5,272,311 | 12/1993 | Gilli et al. | 219/121.67 |
| 5,421,246 | 6/1995 | Tippmann et al. | 99/448 |
| 5,462,599 | 10/1995 | Kuster | 118/503 |
| 5,637,148 | 6/1997 | Kuster et al. | 118/64 |
| 5,651,191 | 7/1997 | Walunas et al. | 34/216 |
| 5,678,323 | 10/1997 | Domingue et al. | 34/266 |
| 5,685,710 | 11/1997 | Martinez Sagrera et al. | 432/500 |
| 5,752,328 | 5/1998 | Yamamoto | 34/217 |
| 5,843,621 | 12/1998 | Schafer | 430/273.1 |

FOREIGN PATENT DOCUMENTS

| | | | |
|---|---|---|---|
| 0 167 899 | 1/1986 | European Pat. Off. | 34/209 |
| 145 951 | 1/1981 | Germany | 34/194 |
| 566 918 | 9/1975 | Switzerland | 34/203 |
| 1449810 A1 | 1/1989 | U.S.S.R. | 34/201 |
| WO 85/02250 | 5/1985 | WIPO | 34/209 |

Primary Examiner—Pamela A. Wilson
Assistant Examiner—Andrea M. Joyce
Attorney, Agent, or Firm—Michele A. Kovaleski; David R. Crichton; Luther A. R. Hall

[57] ABSTRACT

An apparatus for the treatment of flat-form material, especially of coated printed circuit boards, wherein the printed circuit boards are subjected to various treatment processes in succession, such as airflow treatment, drying, and cooling, while they are being transported through a housing in which treatment processes are carried out, there are provided in the housing, for the purpose controlling of the process and increasing the adaptability of the treatment installation, individual treatment zones separate from one another, and the printed circuit boards are conveyed into the individual treatment zones in groups, a separate treatment process being carried out in each treatment zone.

12 Claims, 6 Drawing Sheets

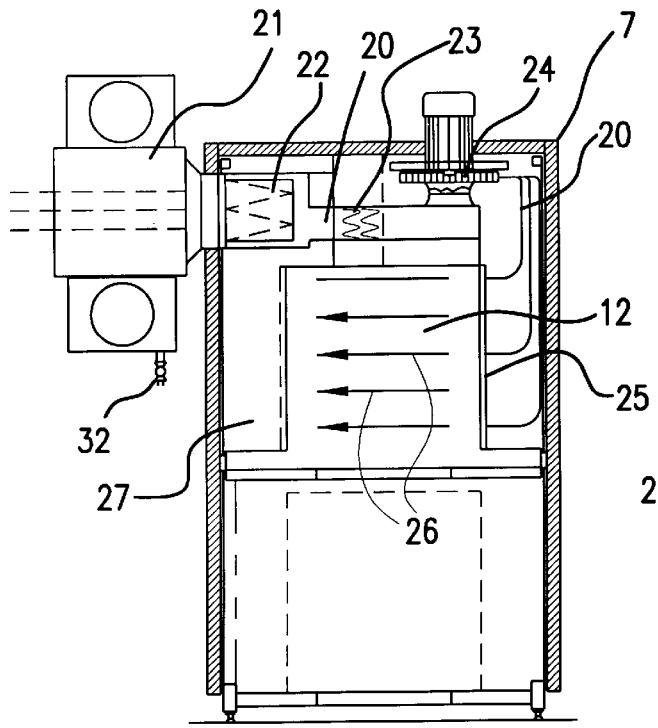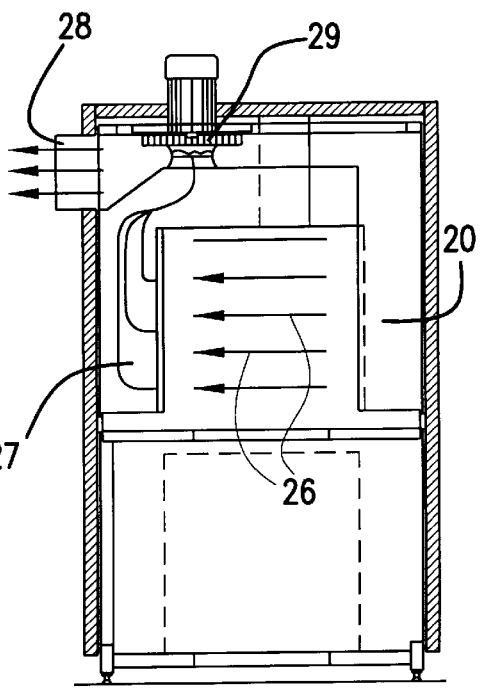
FIG. 2A
FIG. 2C
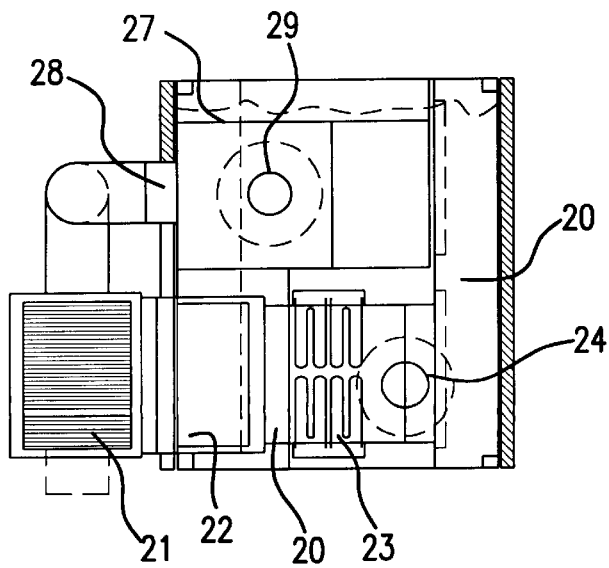
FIG. 2B

PROCESS AND APPARATUS FOR THE TREATMENT OF FLAT-FORM MATERIAL ESPECIALLY OF PRINTED CIRCUIT BOARDS

The invention relates to a process and an apparatus for the treatment o f flat-form material, especially of coated printed circuit boards, solder masks and the like, wherein the printed circuit boards, starting from a coating station, are subjected to various treatment processes in succession.

EP 0,586,772 discloses an apparatus for the coating of printed circuit boards wherein the printed circuit boards coming from the coating station are transferred into an airflow and drying station, inside the housing of which they are introduced into special holding elements, which are fastened to one or more endlessly circulating chains, cables or like transport devices, which transport the printed circuit boards upwards in the housing of the airflow and drying station, the printed circuit boards being turned over at an upper turn-around point and conveyed downwards again, before being conveyed out of the through-flow dryer. In order to utilize the free space above the coating station, that known apparatus is provided with an air treatment module in a housing which is connected to the housing of the through-flow dryer above the transport level of the printed circuit boards. That air treatment module has an air filter for the inlet air, a device for circulating the inlet air and a further device for circulating the outlet air, and a heating device, a heat exchanger and like units, which are required for the various treatment processes for the printed circuit boards.

As the printed circuit boards pass through the airflow and drying station, they are firstly exposed to heated inlet air in the course of being transported upwards and then, while they are being transported downwards and before they are moved out of the housing of the through-flow dryer, the heated printed circuit boards are cooled down again as a result of the passage of cold inlet air from the air treatment module to a cold air duct arranged inside the through-flow dryer on the output side. After flowing over the surface of the printed circuit boards, the cold air is drawn off into the air treatment module via a second outlet air duct.

For controlling the warm and cold airflow in the through-flow dryer, it is necessary to provide in the housing thereof appropriate devices and various sensors, proximity switches and like control elements, which are also exposed to the temperature of the relevant treatment process and by means of which the level of the treatment temperature can be defined. An increase in the capacity of that known device is possible only by increasing the overall size of the installation itself because the treatment time in the through-flow dryer can be controlled only to a limited extent by the circulating speed of the chain conveyor. Furthermore, the processing steps within the through-flow dryer can be changed only to a limited extent because the individual treatment stages merge into one another.

The invention is based on the problem of providing a process and an apparatus of the kind mentioned at the beginning such that the processing steps themselves can be controlled very accurately and changed as desired, a change in the capacity of the installation can easily be made and, in addition, the structure of the installation is simplified.

The problem is solved according to the invention essentially by conveying the printed circuit boards in groups into treatment chambers separate from one another, with a treatment process that can be individually controlled being carried out in each treatment chamber.

As a result of the fact that the individual treatment processes are carried out in separate treatment chambers, each treatment process in each individual chamber can be controlled separately and, as a result, very accurately. An individual process profile can be established in each treatment chamber.

Because, in contrast to the known mode of construction, each group of printed circuit boards is stationary in a closed treatment chamber, there is no need for sensors, proximity switches and like control elements, which previously had to be provided in the through-flow dryer; consequently, in an individual treatment chamber, it is possible to use a relatively high temperature, which would lead to problems in the known mode of construction because of the various control elements in the combined treatment zone.

The fact that each treatment chamber needs to be arranged to accommodate only a group of printed circuit boards results in an installation of compact construction, it being possible to keep down energy consumption because each treatment chamber has only a minimal volume. The small treatment units require only a small amount of air to be supplied for the treatment process and the air treatment can, without great trouble, be so carried out that the requirements of a certain clean-room class are met. That is aided by the fact that there are no circulating parts present in a treatment chamber and also no intermixing takes place as a result of backflow.

In addition, the individual treatment units can have a modular mode of construction, with the overall result that the installation is very highly adaptable to different requirements; for example, a change in capacity requires only the introduction or omission of modules, the treatment steps in an individual chamber can be changed easily without affecting the other chambers, and the individual transport units for the groups of printed circuit boards can be replaced or modified without great trouble.

By way of example, embodiments of the invention are described below in greater detail with reference to the drawing, in which FIG. 1 shows a side view of a first embodiment of a treatment installation having separate treatment chambers;

FIG. 2 shows, in sectional views, an airflow chamber;

Figure 1:
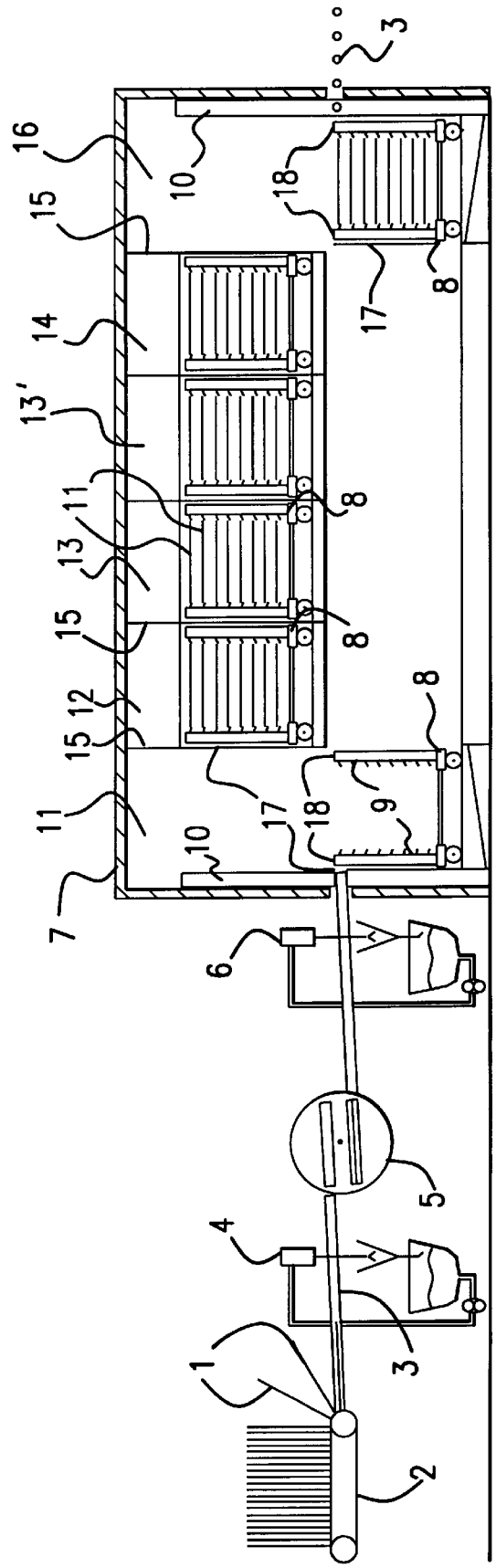

FIG. 1 shows, in a diagrammatic side view, a coating installation in which printed circuit boards 1 are deposited, one after the other, by an unstacking device 2 onto a transporter pathway 3, which passes through a first coating station 4, a turning station 5 and a second coating station 6, from where the transporter pathway 3 passes into the closed housing of a treatment installation 7.

In the treatment installation 7 there are provided pallet trolleys 8 for the purpose of accommodating a group of printed circuit boards 1, which in the embodiment according to FIG. 1 are conveyed above the level of the transporter pathway 3 through treatment chambers 12, 13, 14, which are separate from one another. In the view according to FIG. 1, on the lower level on the input side there is an empty pallet trolley 8, in which the printed circuit boards coming from the coating station 6 are introduced one above the other from top to bottom into holding elements 9, with the result that the individual printed circuit boards are stacked, spaced apart from one another, in the pallet trolley. In that process, the pallet trolley 8 is raised stepwise by a lifting device 10 so that each pair of holding elements 9 will be aligned with the end of the transporter pathway 3 for the purpose of transferring a printed circuit board from the transporter pathway to the pallet trolley. The printed circuit boards 1 therein are arranged to rest on the holding elements 9 by way of their edges which are not provided with surface coating, or by way of the edge of a holding frame that holds a printed circuit board while it is being transported through the coating and treatment installation. Then, the filled pallet trolley 8 is raised by the lifting device 10 to the upper transport level. That region of the lifting device 10 forms a buffer station 11.

From the buffer station 11, a pallet trolley 8 full or partly full of printed circuit boards is moved along the upper transport level into an airflow chamber 12, which is separated from the buffer station 11 and the adjoining drying chamber 13 by means of separating walls 15. The drying chamber 13 is followed by a further drying chamber 13' and then a cooling chamber 14. From the cooling chamber 14 the pallet trolley 8 is conveyed into a buffer zone 16 on the output side, where the pallet trolley 8 is lowered by a further lifting device 10 to the lower transport level. In the position shown in FIG. 1, the individual printed circuit boards 1 are deposited from the pallet trolley 8 onto the transporter pathway 3 leading out of the treatment installation 7, the unloading being carried out by raising the pallet trolley 8 stepwise in the same manner as loading, according to the first-in first-out principle. Then, the empty pallet trolley 8 is returned along the lower transport level from the output-side buffer zone 16 to the input-side buffer zone 11, where the empty pallet trolley is shown in FIG. 1.

In the embodiment shown, each pallet trolley 8 is provided with a separating wall 17 which, in conjunction with the separating walls 15 of the individual treatment chambers, separates each treatment chamber from the adjacent one. For that purpose, the separating walls 17 of the individual pallet trolleys 8 and/or the separating walls 15 of the individual treatment chambers are provided with sealing devices (not illustrated), such as, for example, lip seals, which ensure a substantially air-tight seal between the individual treatment chambers. In the illustrated embodiment, the individual pallet trolleys are provided with only one separating wall 17 so that in the last treatment chamber (the cooling chamber 14) the side is open towards the buffer zone 16. It is also possible, however, for separating walls 17 to be provided on both sides of a pallet trolley so that the last treatment chamber is also separated off from the buffer zone 16.

Each pallet trolley 8 is provided with spaced-apart supports 18, on which the individual holding elements 9 are mounted one above the other. Those supports 18 are displaceably mounted on a pallet trolley, so that the distance between the supports 18 can be adjusted to the width of the printed circuit boards 1 in question. The length of a pallet trolley 8 preferably corresponds to the maximum length of the printed circuit boards to be treated.

Instead of the holding elements 9 shown, which are in the form of supporting ribs inclined slightly downwards and which can be used to receive printed circuit boards of a certain thickness that are sufficiently rigid or do not sag excessively, it is also possible to provide other holding elements, for example gripping devices or clamping elements, by means of which also thin printed circuit boards can be held spaced apart one above the other in a pallet trolley.

The supports 18 with the holding elements 9 are mounted on a pallet trolley 8 preferably so as to be exchangeable, so that a pallet trolley can be quickly re-equipped to accommodate other printed circuit boards.

With the individual pallet trolleys 8 in the position shown in FIG. 1, the empty pallet trolley is firstly filled with printed circuit boards 1 while the pallet trolley in the output-side buffer zone 16 is being emptied and the airflow, drying and cooling treatment of the printed circuit boards is taking place in the individual treatment chambers. In the next step, the filled pallet trolley is raised in the buffer zone 11 and then, after the pallet trolleys have been moved from one treatment chamber to the next, the freshly filled pallet trolley is introduced into the airflow chamber 12, while the pallet trolley from the cooling chamber 14 is being moved out into the buffer zone 16, the pallet trolley from the second drying chamber 13' is being moved into the cooling chamber 14 and the pallet trolley from the first drying chamber 13 is being moved into the second drying chamber 13'. During that step the emptied pallet trolley in the output-side buffer zone 16 can be returned to the first buffer zone 11 and then, after the completely processed pallet trolley 8 has been lowered in the second buffer zone 16, the described operation is repeated.

The buffer zones also serve to allow, for example, a loading operation on the input side to be carried out without interruption while the procedure on the output side is interrupted as a result of a malfunction.

FIG. 2a shows, in cross-section, an airflow chamber 12 having an inlet air duct 20, which opens out above and to the side of the airflow chamber 12 and upstream of which, outside the airflow chamber, there can be arranged a heat exchanger 21 having a condensation drain 32. In the inlet air duct there is preferably arranged a filter 22, downstream of which is a heating element 23. A motor-operated fan impeller for the movement of air is designated by the reference numeral 24. In the cross-sectional view according to FIG. 2a, the inlet air duct extends downwards on the right-hand side, through the height of the pallet trolley, which is open to the side, to the closed base of the airflow chamber 12. Preferably, at least on the side of the inlet air flowing into the pallet trolley, a guide grating 25 is provided, which ensures uniform distribution of air to the entire area through which air is flowing and laminarisation of the flow and as uniform as possible a distribution of the flow of the inlet air between the printed circuit boards in the pallet trolley as indicated by horizontal arrows 26. On the opposite side of the treatment zone in which a pallet trolley (not illustrated in FIG. 2) is located, there extends over the height of the treatment zone, and therefore of a pallet trolley, an outlet air duct 27, which is in communication with an outlet opening 28 shown in FIG. 2c, which is on the same side as the inlet opening, with the result that the outlet air can be passed through the heat exchanger 21. A further motor-operated fan impeller 29 for circulating air is preferably provided in the outlet air duct 27.

The plan view in FIG. 2b shows that the inlet air duct 20 extends over about half of the upper region of the airflow chamber 12 and then widens and extends over the entire width of the treatment zone. Correspondingly, the upper region of the outlet air duct 27 occupies about half the width of the airflow chamber.

Figure 3:
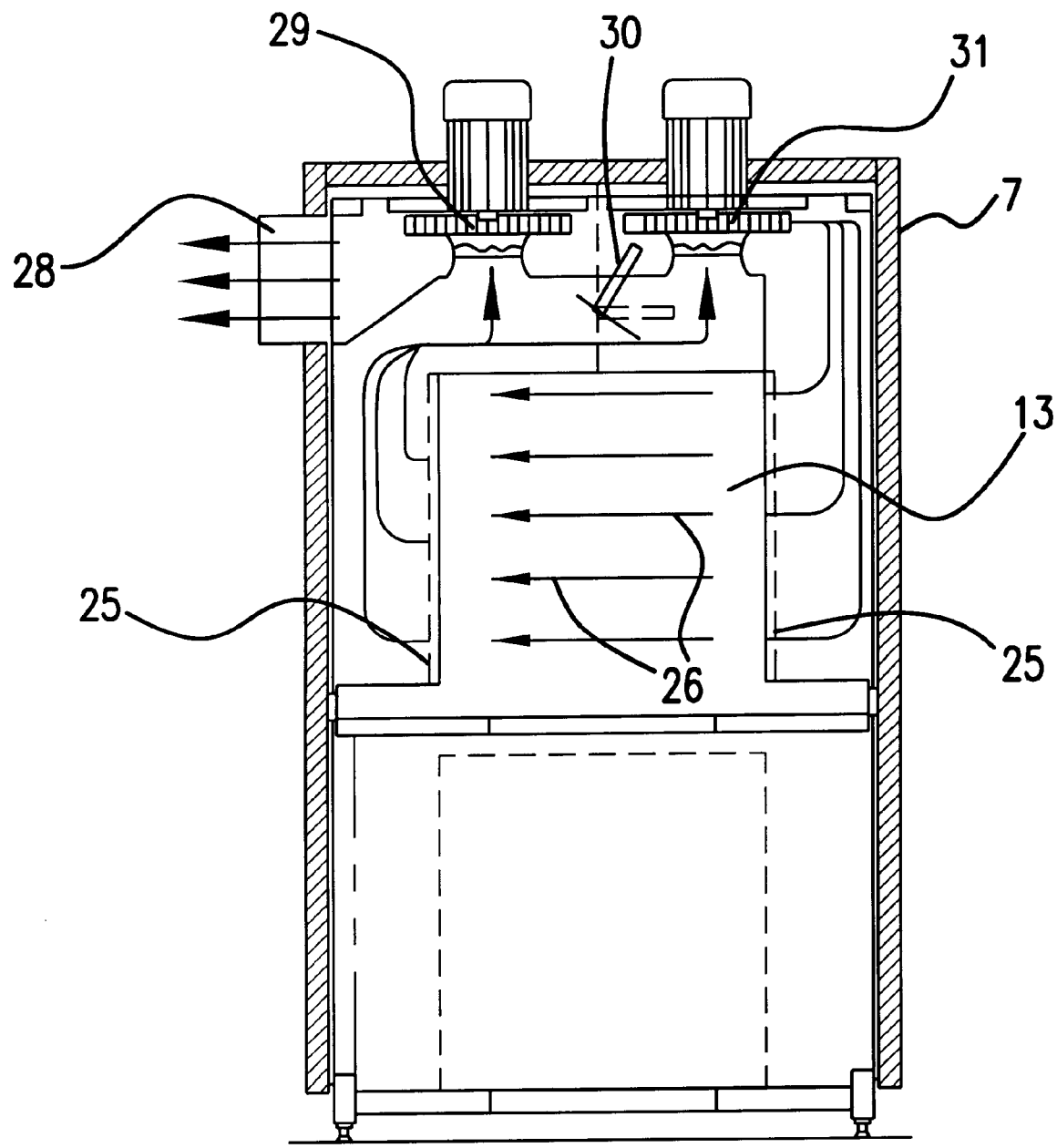
FIG. 3 shows, in sectional view, a drying chamber.

The other treatment chambers can also have a corresponding structure, with a circulating fan 31 having a flap valve 30 preferably being provided in the drying chambers and in the cooling chamber, as shown in a cross-section of a drying chamber 13 in FIG. 3. When operating with circulating air, the air in the drying or cooling chamber is mixed with fresh air and circulated through the treatment zone and, therefore, the pallet trolley.

When a pallet trolley 8 is changed from one treatment chamber to the next, the treatment process in the individual treatment chambers is stopped, with the result that air no longer flows in the treatment chamber and no intermixing of the airflows takes place when the pallet trolley changes from one treatment chamber to another.

Because the individual pallet trolleys are stationary in the relevant treatment chamber during treatment, appropriate control elements for the transport of the pallet trolleys can be arranged outside the housing of the treatment installation 7, with the result that the air flowing through the airflow and drying chambers can be set at very high temperatures, without the sensors and control elements being damaged as a result. Treatment temperatures of from 20 to 200° C. can be provided.

As a result of the fact that each individual treatment chamber 12, 13, 14 is separated from the adjacent one, a suitable process profile can be established in each treatment chamber, for example having a slowly or rapidly increasing temperature, airflow speed, air circulation and/or the like. Consequently, the treatment of the coated printed circuit boards can be controlled and influenced in a very specific manner.

In each treatment chamber, the same conditions can always be maintained for each treatment process because the treatment zone is small and enclosed and effects from other treatment zones do not extend into the chamber.

As a result of the fact that the treatment procedure is split up into individual treatment chambers, the installation can, for example, be so controlled that, starting with a certain pallet trolley, operation is changed over to another treatment procedure.

Since each treatment chamber is provided with fan impellers, the air throughput can be adjusted as required.

Each treatment chamber is preferably constructed in the form of a module so that, for example, in order to enlarge the installation, it is merely necessary to add additional treatment modules. The individual treatment modules can have a substantially identical structure since the airflow path is identical in all the treatment chambers. As a result, the installation is economical to manufacture, with it being necessary in the upper region of a treatment chamber only to fit additional fan impellers or guide elements or to leave out filters and heating elements. Although the housing of the treatment installation 7 forms a closed unit, it is advantageously made up from individual housing elements, each module for a treatment chamber being provided with a housing portion that can be sealingly connected to an adjacent housing portion of another module.

Consequently, the installation overall has a very high degree of adaptability to different requirements. Individual pallet trolleys can be adjusted to accommodate a certain width of printed circuit boards by moving the supports 18, it being possible for a pallet trolley adjusted to a certain width to accommodate printed circuit boards of different lengths.

For printed circuit boards that are, for example, very thin and require special holding elements 9, it is necessary merely to exchange a pallet trolley 8 or the supports 18 together with holding elements 9 on a pallet trolley. It is possible, for example, to use a different trolley for a different group of printed circuit boards without any changes being made to the structure of the treatment installation itself. The capacity of the installation itself can be increased by connecting treatment modules together in series, with, in addition, the buffer zones offering a further possibility for adjustment of the overall treatment procedure. In addition, it is possible to vary the treatment steps in the individual chambers.

A treatment chamber can also be so arranged that, for example, two pallet trolleys can be accommodated in a treatment chamber, so that two pallet trolleys are subjected to the same treatment in a treatment chamber at the same time. In that arrangement, the buffer zones can also be so constructed that only one of the pallet trolleys is lowered, raised and loaded and unloaded, that is to say only one of the pallet trolleys changes to the next treatment chamber.

Figure 4:
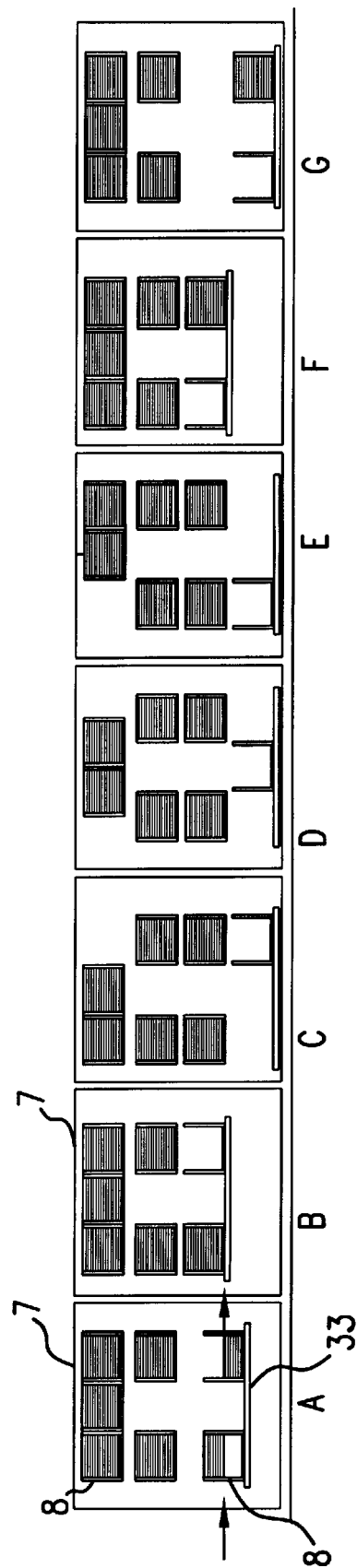
FIG. 4 shows, in diagrammatic form, a modified form of the embodiment according to FIG. 1.

FIG. 4 shows, in diagrammatic view, an enlarged treatment installation 7 and the sequence of the various transport steps. In contrast to the treatment installation shown in FIG. 1, in the embodiment according to FIG. 4 a third transport level is provided above the upper transport level in FIG. 1. In view A, arrows are used to represent the stacking and unstacking of the printed circuit boards on two pallet trolleys 8 arranged on a lifting device 33. View B shows the change in position of the loaded and unloaded pallet trolley resulting from those two trolleys having been raised. View C shows the empty pallet trolley being lowered and the two pallet trolleys arranged above being advanced accordingly, each of which is being transferred to another treatment chamber.

View D shows the empty trolley being moved along the bottom transport level and two filled trolleys being moved along the top transport level into the position shown in E. In view F, the two filled trolleys on the left-hand side have been moved upwards and the empty trolley has been raised to the height of the lower trolley on the right-hand side.

That is followed in view G by the lowering of the full, completely processed trolley and the empty trolley, and there then follows the stacking and unstacking as in A.

In the vertical mode of construction, in which the pallet trolleys are moved essentially in a circuit through the individual treatment chambers, through the loading and unloading stations and through the return zone, the return region is located on the lower, cold, transport level, while the warm treatment region is located at the top. That vertical arrangement makes optimum use of space, while providing an installation that has a compact structure and can be operated continuously.

Figure 5:
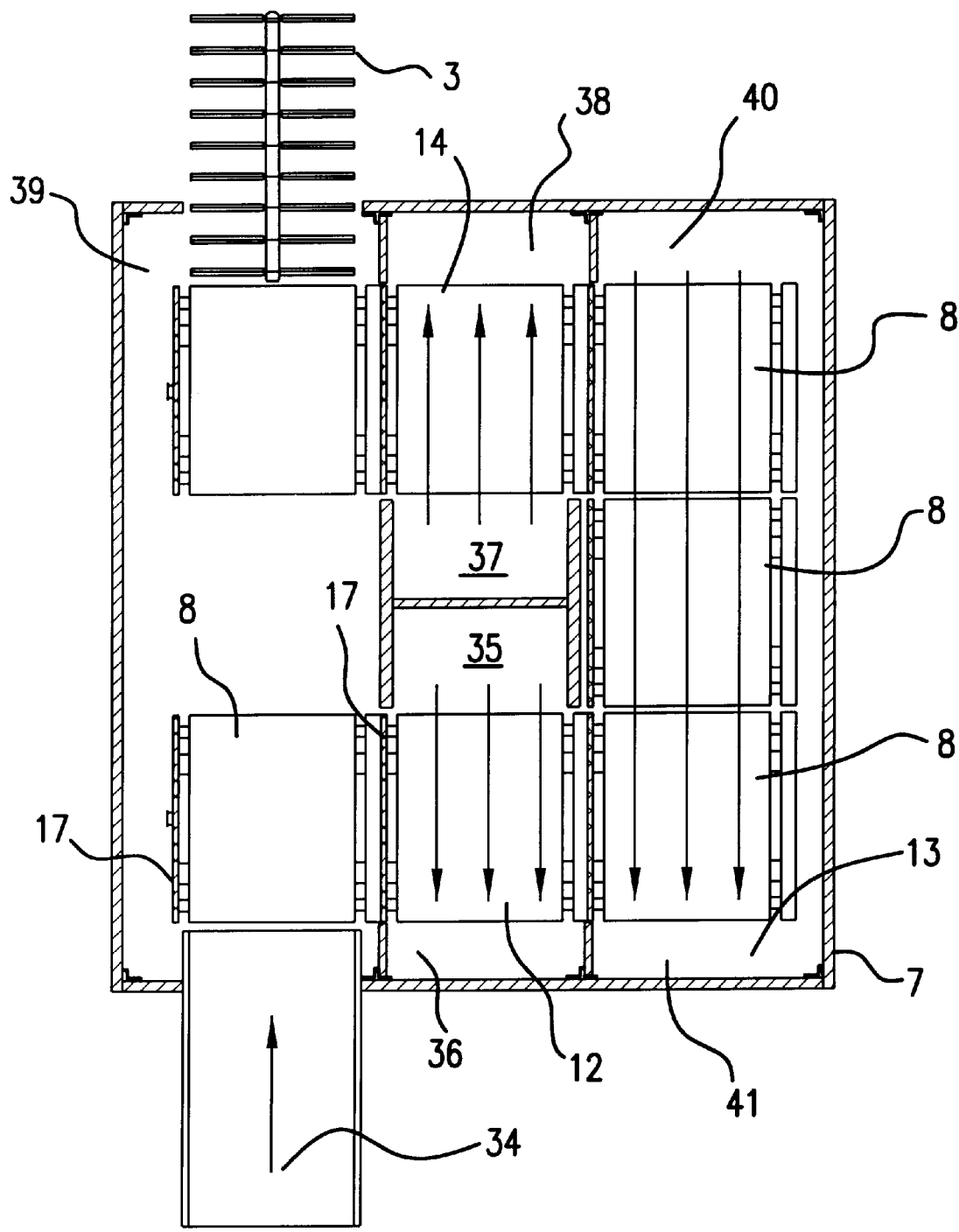
FIG. 5 shows, in plan view, a second embodiment.

FIG. 5 shows, in plan view, a further embodiment of a treatment installation 7, in which the individual treatment chambers are arranged on one horizontal level. In the loading position between the two separating walls 17, the pallet trolley 8 is loaded with printed circuit boards in the direction of the arrow 34 and is then moved, transverse to the loading direction, into an airflow chamber 12, in which there is arranged, for example, approximately in the centre of the treatment installation 7, an inlet air duct 35 for heated air, while on the opposite outer side an outlet air duct 36 is formed by the space between the pallet trolley and the boundary wall of the airflow chamber 12. While the other trolleys are each being advanced by one station, the pallet trolley is moved from the airflow chamber 12 into a drying chamber 13, which in this approximately rectangular transport route extends over three trolley lengths so that there is room for three pallet trolleys at one time in the drying chamber 13. In the next step, the trolley at the top on the right-hand side in FIG. 5 is moved from the drying chamber 13 into the adjacent cooling chamber 14, in which there is provided in the central region of the treatment installation 7 an inlet air duct 37, opposite which, on the outer side, there is arranged an outlet air duct 38. From the cooling chamber 14 the trolley is moved into the unloading position shown by reference numeral 39, where the individual printed circuit boards are deposited onto the transporter pathway 3. After unloading, the empty trolley is returned to the loading position.

In that installation, the warm inlet air in the drying chamber 13 is fed in at reference numeral 40 in an opposite direction (as indicated by arrows) to the direction of transport, so that, after flowing through the pallet trolleys 8, the air is drawn off at reference numeral 41.

In that horizontal arrangement of the individual treatment chambers, the inlet and outlet air units, heat exchangers and the like can be arranged above and/or below the treatment chambers. The omission of lifting devices, as are required in the embodiment according to FIGS. 1 and 4, allows the installation according to FIG. 5 to be produced at a lower cost.

By making the distance between the individual larger and beys 8 in the drying zone 13 larger and by providing separating walls that, for example, can be lowered and raised between the individual portions of the drying zone, it is also possible for separate drying chambers to be constructed for each individual pallet trolley in that region.

Figure 6:
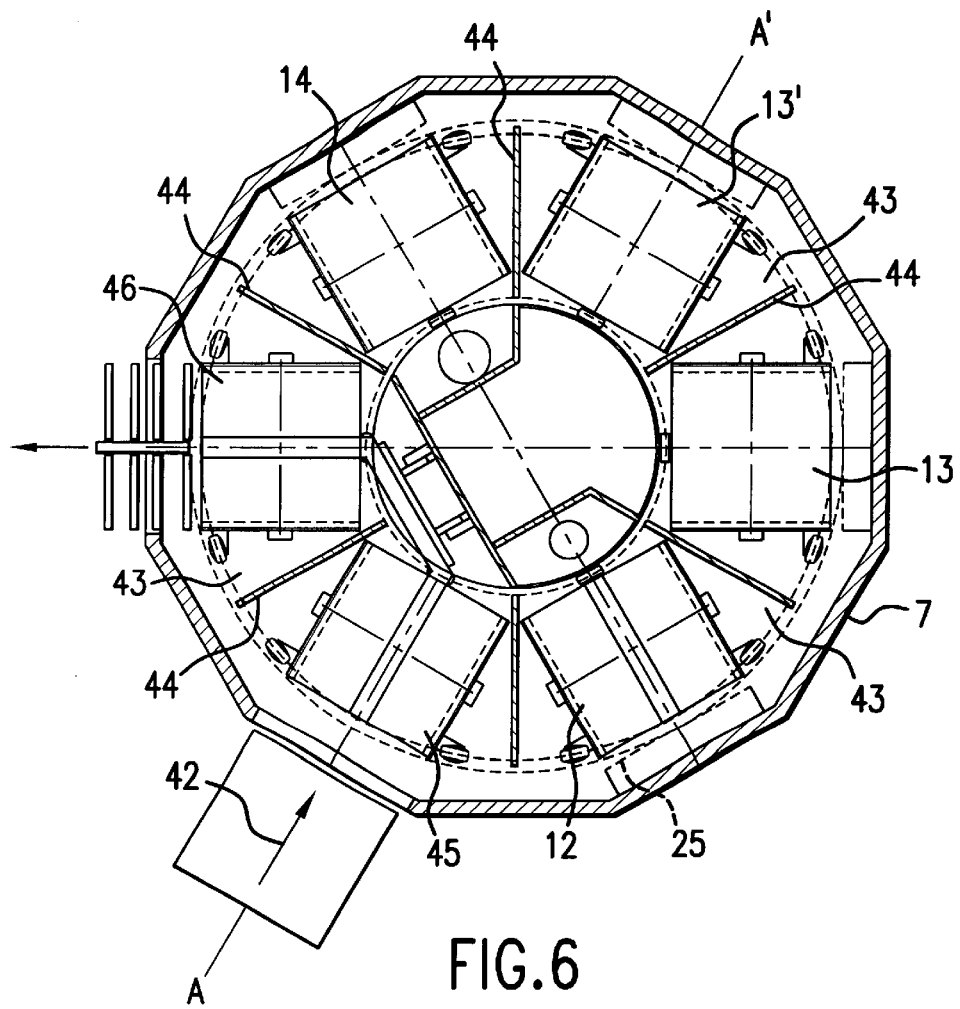
FIG. 6 shows, in plan view, a third embodiment.

FIG. 6 shows, in plan view, a circular arrangement of treatment chambers, with the printed circuit boards being fed in radially at reference numeral 42. The individual treatment chambers and the loading and unloading stations are located on a carousel 43 having separating walls 44 between the individual treatment zones so that, after a pallet trolley has been loaded in the loading station 45 and simultaneously a pallet trolley has been unloaded in the unloading station 46, the carousel is rotated through an angular unit, so that the loaded pallet trolley is moved from the loading station into an airflow station 12, while a pallet trolley is moved from the airflow station into a first drying zone 13. From the second drying zone 13', the trolley is moved into a cooling zone 14 and, thence, into the unloading station 46. The individual treatment chambers in that arrangement are formed by the separating walls 44, which are fixedly mounted on the carousel 43, by the gratings 25 provided at the treatment zones for the purpose of evening the airflow out and by the units mounted above them in a fixed position inside the housing of the treatment installation 7, such as fan impellers, heating elements and the like, as shown in the partial cross-section in FIG. 7. Inlet and outlet air ducts can be provided in the central region of the carousel 43.

Figure 7:
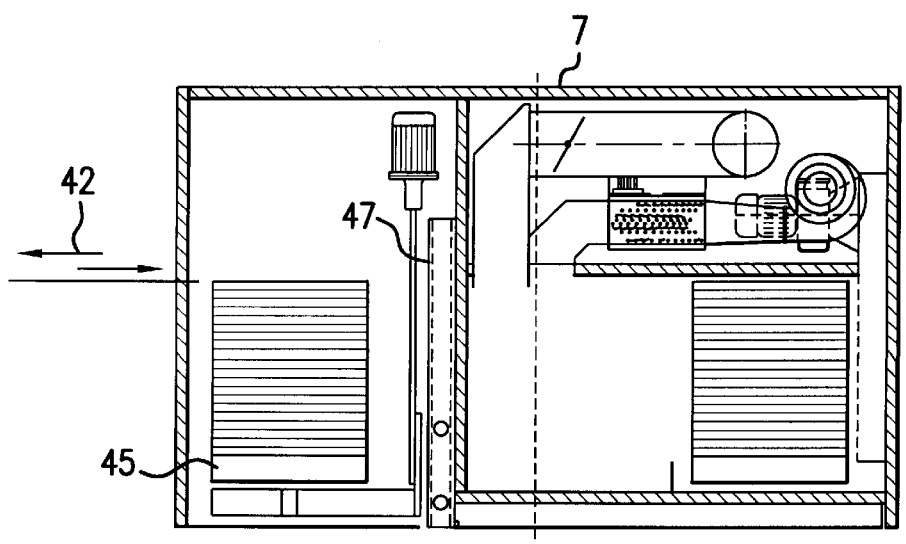
FIG. 7 shows a section along the line A–A' in FIG. 6.

As the sectional view in FIG. 7 shows, there is provided in the loading and unloading stations a lifting device 47, by means of which a pallet trolley can be raised and lowered stepwise for the purpose of loading and unloading the printed circuit boards.

Various modifications of the described forms of construction are possible. For example, a treatment chamber can also be provided with two filters so that the same treatment chamber can be used for various treatment processes.

The individual treatment zones are preferably so configured as to be interchangeable with regard to the processing steps.

The individual pallet trolleys 8 can also be provided with insulation at the separating walls 17.

The described form of construction of a treatment installation is suitable not only for printed circuit boards, solder masks and the like but also for other flat-form material to be treated. The coating can be carried out by screen printing, curtain coating or the like, on one side or on two sides.

Upstream of the first coating station 4 there can be a preheating station, which is constructed in the same modular mode of construction as the airflow or drying chambers. Further treatment processes, such as, for example, hardening and the like, can be provided by further treatment modules.

The printed circuit boards can be taken up and deposited continuously while the individual treatment processes are taking place in the chambers. The printed circuit boards remain in a horizontal position during the entire treatment procedure and do not have to be turned over.

The buffer zones can also be provided separately from the treatment chambers, although it is advantageous to integrate the buffer zones into the closed housing of the treatment installation 7, as shown.

The pallet trolleys 8, which form the transport units, are conveyed through the treatment installation 7 by a conveying device (not described in greater detail). Instead of pallet trolleys, sled-like accommodation units for groups of printed circuit boards can be provided, depending on the practical form of the conveying device.

The described apparatus is especially suitable for the transport of thin printed circuit boards and/or foils.

What is claimed is:

1. An apparatus for the treatment of coated printed circuit boards, having a closed housing (7), through which the printed circuit boards (1), for the purpose of being treated, are transported by means of a conveying device, wherein the housing (7) is divided up into individual treatment chambers (12, 13, 14) separate from one another; and, for transport of the printed circuit boards, pallet trolleys (8), are provided, each of which accommodate a stack of printed circuit boards (1), the pallet trolleys (8) being transported one after the other in steps through the various treatment chambers by means of the conveying device, wherein a buffer zone (11, 16) is located upstream or downstream of the treatment chambers (12, 13, 14), or two buffer zones (11, 16) are located, one upstream and the other downstream, of the treatment chambers (12, 13, 14).

2. An apparatus according to claim 1, wherein the pallet trolleys (8) are transported through the individual treatment chambers (12, 13, 14) along an upper transport level, while an empty pallet trolley is returned from the unloading station to the loading station along a transport level located therebelow.

3. An apparatus according to claim 1, wherein the treatment chambers (12, 13, 14) and loading and unloading stations are arranged to form a rectangular or circular shape in a horizontal plane.

4. An apparatus according to claim 1, wherein each treatment chamber (12, 13, 14) accommodates a pallet trolley (8).

5. An apparatus according to claim 1, wherein at least one separating wall (17) is fixedly mounted on each pallet trolley (8), which separating wall (17), in conjunction with the separating walls (15) fixedly mounted on the individual treatment chambers (12, 13, 14), closes off the treatment chamber after a pallet trolley has been brought into the treatment chamber and wherein sealing means are mounted on the stationary separating walls (15) or on the separating walls (17) or both on the stationary seperating walls (15) and on the seperating walls (17), carried along by the pallet trolleys.

6. An apparatus according to claim 1, wherein the pallet trolleys (8) are provided with spaced-apart, supports (18), on which holding elements (9) are mounted one above the other to provide for the horizontal arrangement of the individual printed circuit boards (1), and wherein the distance between the supports (18) can be adjusted for the purpose of adapting to the width of the printed circuit boards.

7. An apparatus according to claim 1, wherein each treatment chamber (12, 13, 14) is constructed in the form of a module and a plurality of treatment chambers can be combined to form a closed housing (7) of a treatment installation.

8. An apparatus according to claim 7, wherein each module is provided with the units required for the processing steps.

9. An apparatus according to claim 7, wherein in the upper portion of each treatment chamber (12, 13, 14) there are provided, next to one another, horizontal portions of an inlet air and outlet air duct (20, 27), and the inlet air duct (20) extends over the width of the chamber and extends over the height of the treatment chamber, while on the opposite side of the treatment zone the outlet air duct (27) extends upwards from the base of the treatment chamber and merges with the horizontal duct portion.

10. An apparatus according to claim 7, wherein a flow corrector (25) is provided in a treatment chamber, at least on the inflow side of the pallet trolleys (8), for the purpose of laminarisation and distribution of the airflow between the printed circuit boards.

11. An apparatus according to claim 1, wherein the treatment chambers (12, 13, 14) are provided with stationary separating walls (44) and are arranged on a carousel (43), which can be rotated in the closed housing (7).

12. An apparatus according to claim 1, wherein the control elements required for the control of the transport of the pallet trolleys (8) through the treatment chambers (12, 13, 14) are arranged outside the treatment chambers.

* * * * *